United States Patent

Tobashi et al.

(10) Patent No.: US 6,537,924 B2
(45) Date of Patent: Mar. 25, 2003

(54) METHOD OF CHEMICALLY GROWING A THIN FILM IN A GAS PHASE ON A SILICON SEMICONDUCTOR SUBSTRATE

(75) Inventors: Shuji Tobashi, Hiratsuka (JP); Tadashi Ohashi, Kudamatsu (JP); Shinichi Mitani, Numazu (JP); Hideki Arai, Numazu (JP); Hidenori Takahashi, Numazu (JP)

(73) Assignees: Toshiba Ceramics, Co., Ltd., Tokyo (JP); Toshiba Kikai Kabushikikaisha, Tokyo (JP)

( * ) Notice: Subject to any disclaimer, the term of this patent is extended or adjusted under 35 U.S.C. 154(b) by 0 days.

(21) Appl. No.: 09/921,893

(22) Filed: Aug. 6, 2001

(65) Prior Publication Data

US 2002/0045009 A1 Apr. 18, 2002

(30) Foreign Application Priority Data

Aug. 29, 2000 (JP) ......................................... 2000-259178

(51) Int. Cl.$^7$ ............................................. H01L 21/31
(52) U.S. Cl. ..................... 438/758; 438/149; 438/607; 438/763; 118/715; 118/730
(58) Field of Search ................................. 438/763, 758, 438/149, 607; 118/730, 715

(56) References Cited

U.S. PATENT DOCUMENTS 5,766,360 A * 6/1998 Sato et al.
6,059,885 A * 5/2000 Ohashi et al.
6,346,436 B1 * 2/2002 Fukushima et al.

* cited by examiner

Primary Examiner—Long Pham
(74) Attorney, Agent, or Firm—Foley & Lardner

(57) ABSTRACT

A method of chemically growing a thin film in a gas phase using a rotary gaseous phase thin film growth apparatus which feeds a material gas by flowing down the gas from above to a surface of a rotating silicon semiconductor substrate to grow a thin film on a surface of said silicon semiconductor substrate in a method of chemically growing a thin film that a thin film-growing reaction is done wherein: monosilane gas is used as an effective component of the material gas to grow the thin film under a reduced pressure of from $2.7 \times 10^2$ to $6.7 \times 10^3$ Pa with the number of rotations of said silicon semiconductor substrate being from 500 to 2000 min$^{-1}$ and at a reaction temperature of from 600° C. to 800° C.

10 Claims, 2 Drawing Sheets

METHOD OF CHEMICALLY GROWING A THIN FILM IN A GAS PHASE ON A SILICON SEMICONDUCTOR SUBSTRATE

BACKGROUND OF THE INVENTION

1. Field of the Invention

The present invention relates to a method of chemically growing a thin film in a gas phase on a silicon semiconductor substrate. More particularly, the invention relates to a method of chemically growing a thin film in a gas phase on a silicon semiconductor substrate to form a thin film such as a silicon thin film or a silicon epitaxial single crystal thin film on the surface of the substrate by using a rotary gas phase thin film growth apparatus which rotates the silicon semiconductor substrate while feeding a material gas onto the upper surface of the substrate by causing the gas to flow downward from above.

2. Prior Art

A conventional method of chemically growing a thin film in a gas phase on a silicon semiconductor substrate will now be described with reference to FIG. 2 which is a diagram of a relationship between the effective component gas for film-forming, the thin film growth rate and the film-forming temperature.

In the manufacture of a semiconductor, a method of chemically growing a thin film in a gas phase (the CVD method) is generally used to form a thin film on a surface of a silicon semiconductor substrate. In such method of chemically growing a thin film in a gas phase, a material which contains a component of a thin film to be grown is fed such that a depositional growth of a thin film of a desired component is realized by a chemical contact reaction on a surface of a substrate on which the thin film is to be grown.

Further, an apparatus used to operate said method of chemically growing a thin film in a gas phase (the CVD method) is divided broadly into a vertical type apparatus which feeds a material gas onto the surface of a silicon semiconductor substrate from above and a horizontal type apparatus which feeds a material gas to the surface of the silicon semiconductor substrate from sideways.

Now, in case where said horizontal type apparatus is used, it is difficult to grow a silicon single crystal layer such as a silicon epitaxial single crystal thin film or the like uniformly on the surface of the silicon semiconductor substrate having a diameter of 200 mm or more. Moreover, the silicon semiconductor substrate having a diameter of 300 mm or more is nowadays in general use. Therefore, the vertical type apparatus is finding a wider application.

Particularly, in order to grow a thin film having uniform inside characteristics, a single wafer type rotary gas phase thin film growth apparatus which is able to rotate the silicon semiconductor substrate is generally adopted out of a variety of vertical type apparatuses.

In addition, as a material gas to grow such thin film, for example to grow a silicon thin film on the surface of the silicon semiconductor substrate, monosilane ($SiH_4$), dichlorosilane ($SiH2Cl_2$), trichlorosilane ($SiHcl_3$), silicon tetrachloride ($SiCl_4$) or the like is used as an effective component gas.

Said effective component gas is generally mixed, together with a very small amount of dopant (doping material such as $B_2H_6$), with a carrier gas such as hydrogen gas or the like to be fed into a reactor.

Further, in case where said single wafer type vertical rotary gas phase thin film growth apparatus is used to grow the thin film on the surface of the silicon semiconductor substrate by the CVD method, it is known that relationship between the film growth rate and the film-forming temperature of said respective effective component gases is as shown in FIG. 2.

Furthermore, the diagram shown in FIG. 2 is generally called Arrhenius plot, in which a transversal axis is representative of a reciprocal of the temperature whereas a vertical axis is representative of a logarithmically plotted film-forming rate.

It is clear from FIG. 2 that in a high temperature range, a gradient of growth rate is gentle in any effective component gas and a temperature dependency of the growth rate is low, where a film deposition reaction is subject to a material transfer rate.

On the other hand, in a low temperature range, the gradient of growth rate is steep and the temperature dependency of the growing rate is high; that is to say, the film deposition reaction is subject to a reaction rate in this temperature range (low temperature range).

It is clear from the fact mentioned above that the uniformity of the thin film is easily controllable in said high temperature range (material-transfer-rate-dependant area) than in said low temperature range (reaction-rate-dependant area). Therefore, it is general to grow a film (thin film-forming) in the high temperature range. To be more specific, film-forming is done at temperature range of 1000° C. to 1200° C.

By the way, FIG. 2, shows examples of use of the component gases such as monosilane, dichlorosilane, trichlorosilane and silicon tetrachloride that are effective component gases to grow into a silicon thin film on the silicon semiconductor substrate. Of these component gases, a substance having a larger number of chlorines in a molecule thereof has said material-transfer-rate-dependant area closer to the high temperature side. Therefore, conventionally, in a substance having a larger number of chlorines in its molecules, the CVD reaction thereof must be done at a higher temperature.

As a result, an edge dislocation called "slip" is apt to occur within the silicon semiconductor substrate or within the thin film during this heat treatment. Thus, said "slip" dislocation is principally caused by stress concentration due to heat distortion or the like. On the other hand, tensile power of the silicon semiconductor substrate decreases as the temperature rises. Therefore, more slip dislocations are observed as the heat treatment temperature (the film forming temperature) rises.

In addition, the silicon semiconductor substrate with a larger diameter is more likely to produce a warp or a deformation. And the warp or the deformation is produced even by a slightest ununiformity in heating or the like in a silicon semiconductor substrate having a diameter of as large as 300 mm or more.

As a result, by a local stress concentration, the slip dislocation occurs more frequently in the treatment at the film-growing temperature which has not been a problem in case where the diameter of the silicon semiconductor substrate is smaller. Recently, as the diameter of the silicon semiconductor substrate tends to be larger, such occurrence of the slip dislocation is becoming a serious problem.

SUMMARY OF THE INVENTION

It is an object of the present invention to provide a method of chemically growing a thin film in a gas phase which is able to grow a film in a low temperature range, restrain an occurrence of a slip dislocation of a silicon semiconductor substrate and obtain a thin film whose quality is more than or equal to the conventional thin film.

The present invention provides a method of chemically growing a thin film in a gas phase using a rotary gas phase thin film growing apparatus which feeds a material gas by causing the gas to flow downward from above onto a surface of a rotating silicon semiconductor substrate to grow a thin film thereon such that a thin film-growing reaction is done wherein monosilane gas is used as an effective component of the material gas to grow into a thin film, under a reduced pressure of from $2.7 \times 10^2$ to $6.7 \times 10^3$ Pa, with the number of rotations of said silicon semiconductor substrate being from 500 to 2000 $min^{-1}$ and the reaction temperature being from 600° C. to 800° C.

Here, it is desired that a silicon thin film growth rate of said thin film growing reaction is within a range of 0.01 to 0.5 $\mu$m/min.

It is further, desired that composition of said material gas is monosilane gas from 0.5 to 20 mol %, a doping material from 0.1 to 50 ppb and the remainder is a carrier gas. Furthermore, it is desired that said carrier gas is hydrogen gas.

Further, it is desired that the downward flow rate of said material gas is from 0.01 to 0.15 L(litter)/$cm^2$·min.

The present invention uses the rotary gas phase thin film growing apparatus and the CVD method to grow a thin film on the silicon semiconductor substrate under a specific film-growing condition that is to say, using monosilane as an effective component of the material gas, causing the material gas to flow downward onto the surface of the silicon semiconductor substrate from above, controlling the number of rotation of the silicon semiconductor substrate in a range of 500 to 2000 $min^{-1}$ while operating under a reduced pressure of $2.7 \times 10^2$ to $6.7 \times 10^3$ Pa and causing a reaction in a temperature range of 600° C. to 800° C.

Thereby, an occurrence of a slip dislocation on the silicon semiconductor substrate can be restrained and more particularly, the occurrence of slip dislocation on the silicon semiconductor substrate having a diameter of as large as 300 mm or more can be restrained, which was conventionally considered difficult.

Moreover, a film growth rate is 0.01 to 0.5 $\mu$m/min which indicates that it is possible to grow the high or equal quality thin film of uniform thickness without a rapid decrease of a film-growth rate as compared to that of the conventional method.

Furthermore, it is observed that the insulating pressure resistance characteristic of an oxide film obtained by oxidizing the grown thin film has an inside film characteristic of equal to or slightly higher than the thin film formed by a conventional method. Particularly, the method of chemically growing a thin film in a gas phase employed in the present invention is desirable for a method to grow a single crystal thin film such as a silicon epitaxial single crystal layer or the like on the silicon semiconductor substrate.

DETAILED DESCRIPTION OF THE PREFERRED EMBODIMENTS

Hereinafter, a method of chemically growing a thin film in a gas phase on a silicon semiconductor substrate according to the present invention will be explained in detail and concretely with reference to the drawings.

For a gas phase thin film growth system (CVD apparatus) used in a method of chemically growing a thin film in a gas phase employed in the present invention, a vertical type apparatus may be used without particular limitations as long as said apparatus is capable of starting a gas phase growth reaction under conditions of a reduced pressures, the number of rotations of the substrate and the reacting temperature (film-growing temperature) as prescribed in the present invention.

As discussed above, there are two types of gas phase thin film growth system (CVD apparatus); that is, there are two types of apparatuses. One of said two types is a vertical type apparatus, which feeds a material gas from above approximately perpendicular to a rotating silicon semiconductor substrate, and the other is a horizontal type apparatus, which causes the material gas to flow approximately parallel to the silicon semiconductor substrate. However, in the present invention, the vertical type CVD apparatus, which is more advantageous in view of growing a homogeneous thin film on a large diameter silicon semiconductor substrate.

Further, said CVD apparatus is classified into a single wafer type apparatus, which produces the silicon semiconductor substrate such as a silicon wafer or the like one by one, and a batch type apparatus, which produces tens of substrates at once. Even though there is no limitation to the type of the apparatus to be used in the present invention, it is desirable to use the single wafer type apparatus because the control of a high-speed rotation of the silicon semiconductor substrate, a condition of a reacting gas stream on a upper surface of the substrate or in the proximity thereof, or a uniform heating of the substrate is comparably easier.

Figure 1:
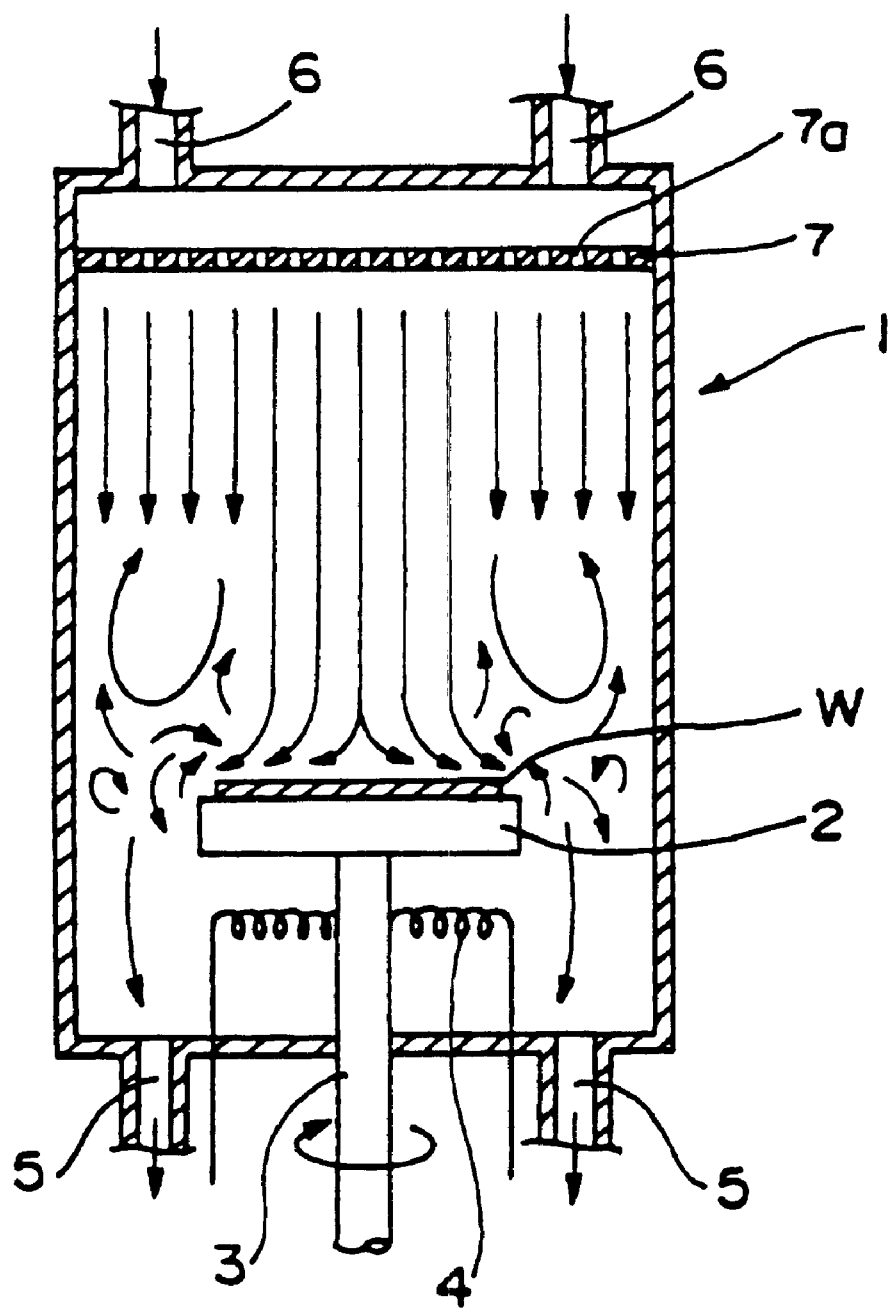
FIG. 1 is a cross-sectional view schematically illustrating an example of a vertical rotary gas phase thin film growth system used in the present invention.
Figure 2:
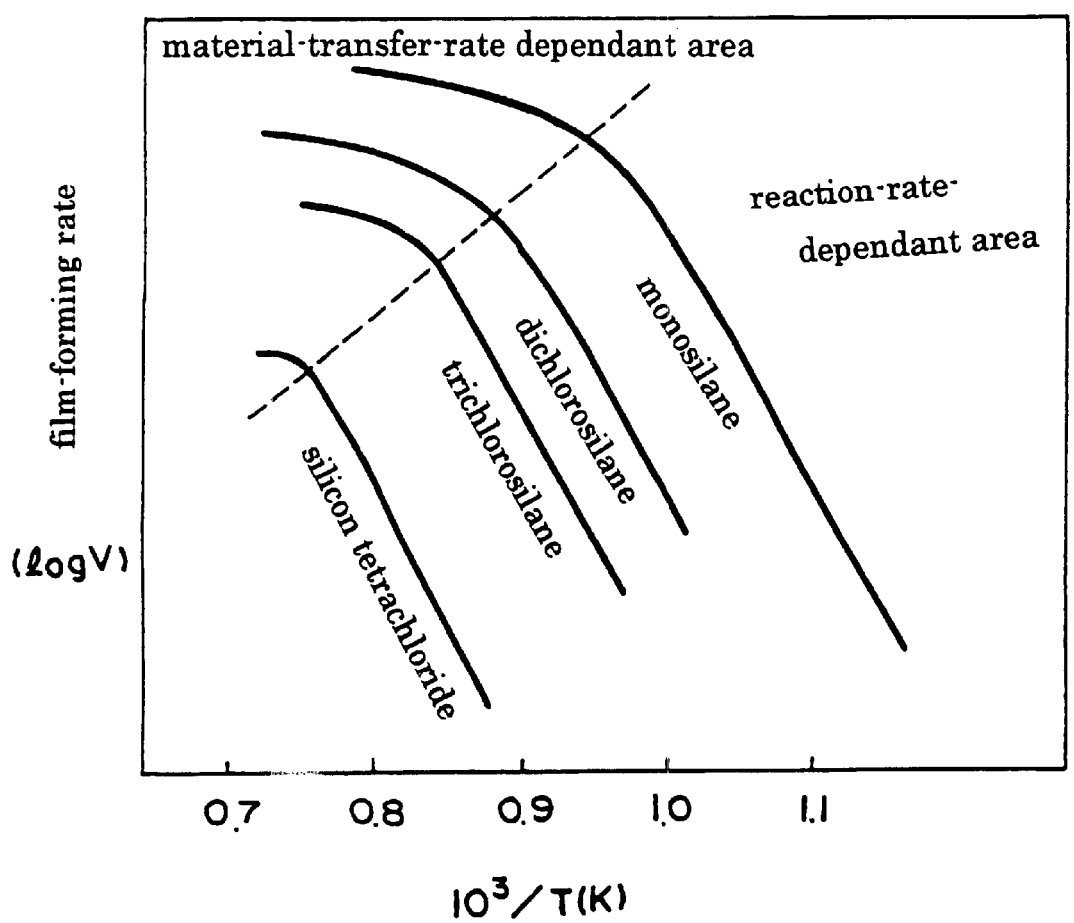
FIG. 2 is a diagram of a relationship between the effective component gas to grow a film, the thin film growth rate thereof and the film-growing temperature.

As an example for an apparatus used in the present invention, a single wafer type rotating gas phase thin film growth system as shown in FIG. 1 can be adopted.

The structure of said single wafer type rotary gas phase thin film growth system (CVD apparatus) is described below. As shown in FIG. 1, a plurality of gas introducing tubes 6, which feed a material gas into a reactor are arranged on top of a reactor 1 and a flow straightening plate 7 formed with a plurality of holes to straighten the gas flow is provided beneath the gas introducing tube 6.

Further, a substrate holder 2 to support a silicon semiconductor substrate W thereon and a rotary shaft 3 for rotating the substrate holder 2 are provided beneath said flow straightening plate 7.

Furthermore, a heater 4 is provided beneath the substrate holder 2. Also, symbol 5 used in FIG. 1 denotes drainpipes for discharging a waste gas containing unreacted gases in the reactor.

Although not shown in FIG. 1, a motor for rotating the rotary shaft 3 is provided at a lower portion (normally near the bottom) thereof.

To grow a thin film in a gas phase on a silicon semiconductor substrate using such an apparatus described above is as follows; at first a material gas is fed through the gas introducing tube 6, then uniformalize momentum and pressure distribution of the gas, and then feed a gas flow having a uniform flow rate through a holes 7a formed on the flow straightening plate 7 to grow a thin film in a gas phase on a surface of the substrate.

In the present invention, monosilane ($SiH_4$) gas is used as an effective component of the material gas to grow a thin film.

In case where a gas other than monosilane gas, such as dichlorosilane, trichlorosilane, silicon tetrachloride or the like, is used as an effective component for growing the thin film, it will not react sufficiently to meet the conditions prescribed in the present invention and growth rate is so slow that it is not good for practical use.

Said monosilane gas as an effective component is generally mixed, together with a very small amount of doping material (Dopant), with a carrier gas to be fed as a material gas on the surface of the rotating substrate almost perpendicularly from the upper portion of the apparatus.

Generally, inactive gas, such as argon (Ar), helium (He), hydrogen ($H_2$) and the like, or reductive gas is used as a carrier gas. Of these, it is desirable to use the hydrogen gas.

For the used doping material other than $B_2H_6$, $BCl_3$, $AsH_3$, $PH_3$ can be listed as examples.

Said monosilane gas is normally contained into the carrier gas, such as hydrogen gas, in an amount of 0.5 to 20 mol % and more preferably from 5 to 15 mol %. And Dopant such as $B_2H_6$ is mixed therein an amount of 0.1 to 50 ppb.

In a method employed in the present invention, said material gas is caused to flow downward to be fed on the surface of the rotating silicon semiconductor substrate within the apparatus with the inside flow rate of from 0.01 to 0.15 L/(cm$^2$·min) and more preferably from 0.02 to 0.10 L/(cm$^2$·min).

And while maintaining a reduced inside pressure of the apparatus from $2.7 \times 10^2$ to $6.7 \times 10^3$ Pa and more preferably from $1.3 \times 10^3$ to $2.7 \times 10^3$ Pa, the substrate is rotated with rotations of from 500 to 2000 min$^{-1}$ and more preferably from 1000 to 1500 min$^{-1}$, and then a film depository reaction is caused at a reaction temperature (film-growing temperature) of from 600° C. to 800° C. and more preferably from 700° C. to 750° C.

Furthermore, it is desirable in view of the need for improvement of the inside characteristics such as insulation property (such as instant breakdown property and lapse breakdown property) of the film formed on the substrate and obtained by oxidation thereof that the growth rate of the thin film on the surface of the substrate is maintained in a range of 0.01 to 0.5 μm/min.

In said temperature range of 600° C. to 800° C., monosilane is subject to the reaction rate such that the film-growth rate can be changed over a wide range by changing the reaction temperature little by little. Further, by changing concentration of monosilane, the pressure inside the apparatus, and gas flow rate, and furthermore by changing combination thereof, it is able to control the growth rate to a desired rate within the range mentioned above.

The silicon thin film grown on the silicon semiconductor substrate with the method employed in the present invention may be a polycrystal layer or a single crystal layer. However, the method employed in the present invention produces the uniform and fine thin film when applied to the formation of the single crystal layer, particularly an epitaxial single crystal layer.

Further, a diameter of the silicon semiconductor substrate on which the thin film is grown is not limited to a particular value, but from the point of view of restraining an occurrence of a slip dislocation at the time of thin film-growing, and for the purpose of making an effect of which the grown thin film is uniform and excellent in the inside characteristics, it is desirable to employ a silicon semiconductor substrate having a diameter of as large as 300 mm or more.

EXAMPLES

Example 1 and Comparative Example 1

A silicon semiconductor substrate having a diameter of 300 mm in a single wafer rotary gas phase thin film growth system, which is of a vertical type, was treated under the following growing conditions to grow a silicon epitaxial single crystal layer thin film (Example 1).

| GROWTH CONDITIONS: | |
|---|---|
| Pressure within a reactor: | $2.7 \times 10^3 \pm 2.7 \times 10$ Pa |
| Numbers of substrate rotations: | 1500 min$^{-1}$ |
| Flow rate of hydrogen (carrier) gas: | 0.1 L/(cm$^2$ · min) |
| Concentration of SiH$_4$ (effective component): | 8 mol % |
| Concentration of B$_2$H$_6$ (Dopant): | 20 ppb |
| Reaction temperature(film-growth temperature): | 800° C. |

Moreover, the concentration of $SiH_4$ of the growth conditions mentioned above was changed such that various thin film growth rates as shown in Table 1 were tried.

Furthermore, by using a similar substrate to the silicon semiconductor substrate used in the Example 1 and treating the same in a similar manner as the Example 1 with an exception of changing the reaction temperature to 100° C., a silicon epitaxial single crystal layer thin film was grown (Comparative Example 1).

The silicon thin film growing substrates of Example 1 and the Comparative Example 1 were heat oxidized at 900° C. in a dried oxygen atmosphere respectively and oxide films with a thickness of up to 200 Å were grown on the surface of respective substrates. Then, the oxide film pressure resistance measurement (instantaneous breakdown testing: TZDB) was performed to these oxide film layers.

As a result, in the Example 1, A-mode breakdown (breakdown electric field of 1 MV/cm or less) was 1.9%, B-mode breakdown (breakdown electric field of 3 to 7 MV/cm) was 1.4, and the remainder was C-mode breakdown (breakdown electric field of 8 MV/cm or more).

In the Comparative Example 1, A-mode breakdown was 1.6%, B-mode breakdown was 20% and the remainder was C-mode breakdown.

From the results mentioned above, the oxide film pressure resistance of the Example 1 was recognized to stand comparison with a conventional article.

Example 2 and Comparative Example 2

With a exception of having the film-growing temperature at 700° C., the silicon film-growing and oxidizing treatment of the films were done in the same manner as the Example 1 and then the oxide film pressure resistance measurement was performed in the same manner as Example 1 (Example 2). Moreover, in the Example 2, a different thin film growth rate was tried in the same manner as the Example 1 as shown in Table 1.

Furthermore, as a Comparative Example 2, with a exception of having the film-growing temperature at 900° C., the silicon film-growing and oxidizing treatment of the films were done in the same manner as the Example 1 and the oxide film pressure resistance measurement was performed.

As a result, in the Example 2, A-mode breakdown was 0%, B-mode breakdown was 1.0% and the remainder was C-mode breakdown.

Further, in the Comparative Example 2, A-mode breakdown was 1.6%, B-mode breakdown was 0% and the remainder was C-mode breakdown.

Example 3

With an exception of having the film-growing temperature at 600° C., the silicon film-growing and oxidizing treatment of the films were done in the same manner as the Example 1 and then the oxide film pressure resistance measurement was performed in the same manner as the Example 1 (Example 3). Moreover, in the Example 3, a different thin film growing rates were tried in the same manner as the Example 1 as shown in Table 1.

The aforementioned results are shown in Table 1. Moreover, in Table 1, a symbol—is untested, a symbol ○ is a standard article, which showed an evaluation better than or equal to the thin film in the Comparative Example 1 of film-growing temperature of 1000° C.(growth rate of 1 μm/min), and a symbol × is a rejected article, which showed an evaluation worse than the thin film in the Comparative Example 1 and the Comparative Example 2, respectively.

TABLE 1

| Reaction temperature (Film-growing temperature) (° C.) | | Example 1 800 | Example 2 700 | Example 3 600 | Comparative Example 1 1000 | Comparative Example 2 900 |
|---|---|---|---|---|---|---|
| Growth rate ($\mu$m/min) | 0.01 | — | ○ | ○ | — | — |
| | 0.05 | — | ○ | x | — | — |
| | 0.1 | ○ | ○ | x | — | — |
| | 0.3 | ○ | ○ | x | — | ○ |
| | 0.5 | ○ | x | — | ○ | ○ |
| | 1 | x | — | — | ○ | ○ |
| | 2 | x | — | — | ○ | ○ |
| | 3 | x | — | — | ○ | ○ |
| | 4 | — | — | — | ○ | ○ |
| | 8 | — | — | — | ○ | x |

It is clear from Table 1 shown above, that at the reacting temperature of 600° C. to 800° C., in a growth rate of 0.01 $\mu$m/min to 0.5 $\mu$m/min thereof, a thin film, whose quality is better than or equal to the conventional thin film, can be obtained.

In a method of chemically growing a thin film in a gas phase in accordance with the present invention, it is able to grow a film in lower temperature, restrain an occurrence of a slip dislocation of a silicon semiconductor substrate and obtain a thin film whose quality is better than or equal to the conventional thin film.

What is claimed is:

1. A method of chemically growing a silicon thin film or a silicon epitaxial single crystal thin film in a gas phase on the whole surface of a silicon semiconductor substrate using a rotary gas phase thin film growing apparatus which feeds a material gas by causing the gas to flow downward such that a thin film is grown on a surface of said silicon semiconductor substrate comprising the step of:

using monosilane gas as an effective component of the material gas to grow the thin film under a reduced pressure of from $2.7 \times 10^2$ to $6.7 \times 10^3$ Pa with rotations of said silicon semiconductor substrate being from 500 to 2000 min$^{-1}$ at a reaction temperature of from 600° C. to 800° C.

2. A method of chemically growing a thin film in a gas phase on a silicon semiconductor substrate according to claim 1, wherein a thin film growth rate of said thin film growth reaction is within a range of 0.01 to 0.05 $\mu$m/min.

3. A method of chemically growing a thin film in a gas phase on a silicon semiconductor substrate according to claim 1, wherein said material gas has a flow rate of from 0.01 to 0.15 L(litter)/cm$^2$·min.

4. A method of chemically growing a thin film in a gas phase on a silicon semiconductor substrate according to claim 2, wherein said material gas has a flow rate of from 0.01 to 0.15 L(litter)/cm$^2$·min.

5. A method of claim 1, wherein the pressure is $1.3 \times 10^3$ to $2.7 \times 10^3$ Pa.

6. A method of claim 1, wherein the temperature is 700° C. to 750° C.

7. A method of claim 1, wherein the substrate is rotated at 1000 to 1500 rotations per minute.

8. A method of claim 2, wherein:

the pressure is $1.3 \times 10^3$ to $2.7 \times 10^3$ Pa;

the temperature is 700° C. to 750° C.;

the substrate is rotated at 1000 to 1500 rotations per minute; and the growth rate is 0.01 to 0.3 $\mu$m/min.

9. A method of claim 2, wherein the growth rate is 0.01 to 0.3 $\mu$m/min.

10. The method of claim 9, wherein the temperature is 700° C. to 800° C.

* * * * *